US006580282B1

(12) United States Patent
Lieutard et al.

(10) Patent No.: US 6,580,282 B1
(45) Date of Patent: Jun. 17, 2003

(54) MACHINE FOR TESTING ELECTRONIC CHIPS

(75) Inventors: Thierry Lieutard, Seyssinet (FR); Bernard Faure, Grenoble (FR); René Monnet, Vizille (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/346,880

(22) Filed: Jul. 2, 1999

(30) Foreign Application Priority Data

Jul. 3, 1998 (FR) ............................................ 98 08561

(51) Int. Cl.[7] .............................................. G01R 31/02
(52) U.S. Cl. ........................ 324/760; 324/754; 324/758
(58) Field of Search ................................ 324/760, 758, 324/754; 165/80.1, 80.4, 80.5

(56) References Cited

U.S. PATENT DOCUMENTS

| 3,963,985 | A | * | 6/1976 | Geldermans | 324/754 |
|---|---|---|---|---|---|
| 4,962,355 | A | * | 10/1990 | Holderfield et al. | 324/760 |
| 5,124,639 | A | * | 6/1992 | Carlin et al. | 324/760 |
| 5,198,752 | A | * | 3/1993 | Miyata et al. | 324/760 |
| 5,321,352 | A | * | 6/1994 | Takebuchi | 324/758 |
| 5,325,052 | A | * | 6/1994 | Yamashita | 324/760 |
| 5,412,329 | A | * | 5/1995 | Iino et al. | 324/754 |
| 5,479,109 | A | * | 12/1995 | Lau et al. | 324/760 |
| 5,517,126 | A | * | 5/1996 | Yamaguchi | 324/760 |
| 5,521,523 | A | * | 5/1996 | Kimura et al. | 324/760 |
| 5,614,837 | A | * | 3/1997 | Itoyama et al. | 324/760 |
| 6,043,671 | A | * | 3/2000 | Mizuta | 324/760 |
| 6,072,325 | A | * | 6/2000 | Sano | 324/760 |
| 6,073,681 | A | * | 6/2000 | Getchel et al. | 165/80.1 |

OTHER PUBLICATIONS

French Search Report dated Mar. 24, 1999 with annex on French Application No. 98–08561.

* cited by examiner

*Primary Examiner*—Kamand Cuneo
*Assistant Examiner*—Jermele Hollington
(74) *Attorney, Agent, or Firm*—Lisa K. Jorgenson; Stephen Bongini; Fleit, Kain, Gibbons, Gutman & Bongini P.L.

(57) ABSTRACT

A machine for testing electronic components or chips formed in a wafer (3) and each comprising a multiplicity of electrical connection pads formed on the surface of the wafer, which machine includes a test head (5) having a multiplicity of electrical connection test prods (11) and a mechanism for moving the wafer to be tested with respect to the head so as to bring the ends of the test prods into contact with the pads of each chip, in succession. The test head (5) carries heating and temperature-regulating elements (18) thermally coupled to the electrical connection test prods (11). Preferably, the test head (5) includes a metal block (16) thermally coupled to the electrical connection test prods (11). The heating and temperature-regulating elements (18) are thermally coupled to the metal block.

21 Claims, 4 Drawing Sheets

MACHINE FOR TESTING ELECTRONIC CHIPS

CROSS-REFERENCE TO RELATED APPLICATIONS

This application is based upon and claims priority from prior French Patent Application No. 9808561, filed Jul. 3, 1998, the entire disclosure of which is herein incorporated by reference.

FIELD OF THE INVENTION

The present invention generally relates to semiconductor electronics and more specifically, a machine for testing electronic components or chips which make up integrated circuits produced in a wafer and each including multiplicity of electrical connection pads formed on the surface of the wafer.

BACKGROUND OF THE INVENTION

Known test machines generally include a test head which has a multiplicity of electrical connection test prods and means, and in general, a manipulator, for moving the wafer to be tested with respect to the head so as to bring the ends of the prods into contact with the pads of each chip, in succession.

Such machines are used for testing electronic components or chips which make up integrated circuits produced in a wafer and each including a multiplicity of electrical connection pads formed on the surface of the wafer.

When the end of each prod comes into contact with each of pads of a chip to be tested, the prods, which do not extend perpendicularly to the wafer, deform slightly in order to produce a contact force and their ends slide over the surface of the pads, this sliding action improving the electrical connection by scraping off the oxides.

In order to improve the results of the tests carried out, the electronic chips are placed in situations similar to those in which they will be in during their subsequent use. This is why some manipulators are provided, in their test zone, with heating means which allow the wafers to be tested to be heated from below up to temperatures which may range between 80° C. and 125° C. In practice, when a wafer, to be tested, is brought into the test zone, and after it has reached the desired temperature, its electronic chips are tested in succession.

Especially given the fact that the wafers undergo dimensional variations when they are heated, that the heated wafer radiates heat in an uncontrolled manner towards the test head and, in particular, towards its electrical connection test prods, that the electrical connection test prods take heat from the heated wafer when they are in contact with its surface and that each side of the connection pads of the electronic chips is generally less than 100 microns, great difficulties are encountered at the present time in controlling the space around the electrical connection test prods of the test head and in programming the horizontal displacement steps of the manipulator which allow it to pass from one electronic chip to another.

Further, when an electronic chip is declared to be defective, it may not be known for certain whether this result is actually due to the electronic chip tested. This negative result may in fact be due to the lack of contact between at least one of the electrical connection test prods and the corresponding pad on the electronic chip tested.

BRIEF DESCRIPTION OF THE DRAWINGS

The present invention will be more clearly understood on studying a machine for testing electronic chips, described by way of non-limiting example and illustrated by the drawing.

SUMMARY OF THE INVENTION

An object of the present invention is to improve the certainty and reliability of tests for electronic chips, particularly as in regards to the contacting of the ends of electrical connection test prods with the corresponding pads on the electronic chips tested.

According to the invention, a machine, for testing electronic components or chips formed in a wafer, includes a test head which carries heating and temperature regulating means which are thermally coupled to electrical connection test prods for use in testing electronic components or chips.

DETAILED DESCRIPTION OF PREFERRED EMBODIMENTS

Preferred embodiments of the present invention will be described in detail hereinbelow with reference to the attached drawings According to an embodiment of the invention, the test head may advantageously include a plate or board which carries, in its central part, a metal ring for supporting the electrical connection test prods via an electrically insulating material, this ring being provided, on the opposite side from the electrical connection test prods, with a metal block, preferably an annular metal block, to which the heating and temperature-regulating means are thermally coupled.

According to the invention, the heating and temperature-regulating means include at least one electrical heating element thermally coupled to the block, a detector for detecting the temperature of this block, and means for supplying electrical power and for regulating this power supply so that the temperature of the block is maintained at a predetermined value.

Figure 1:
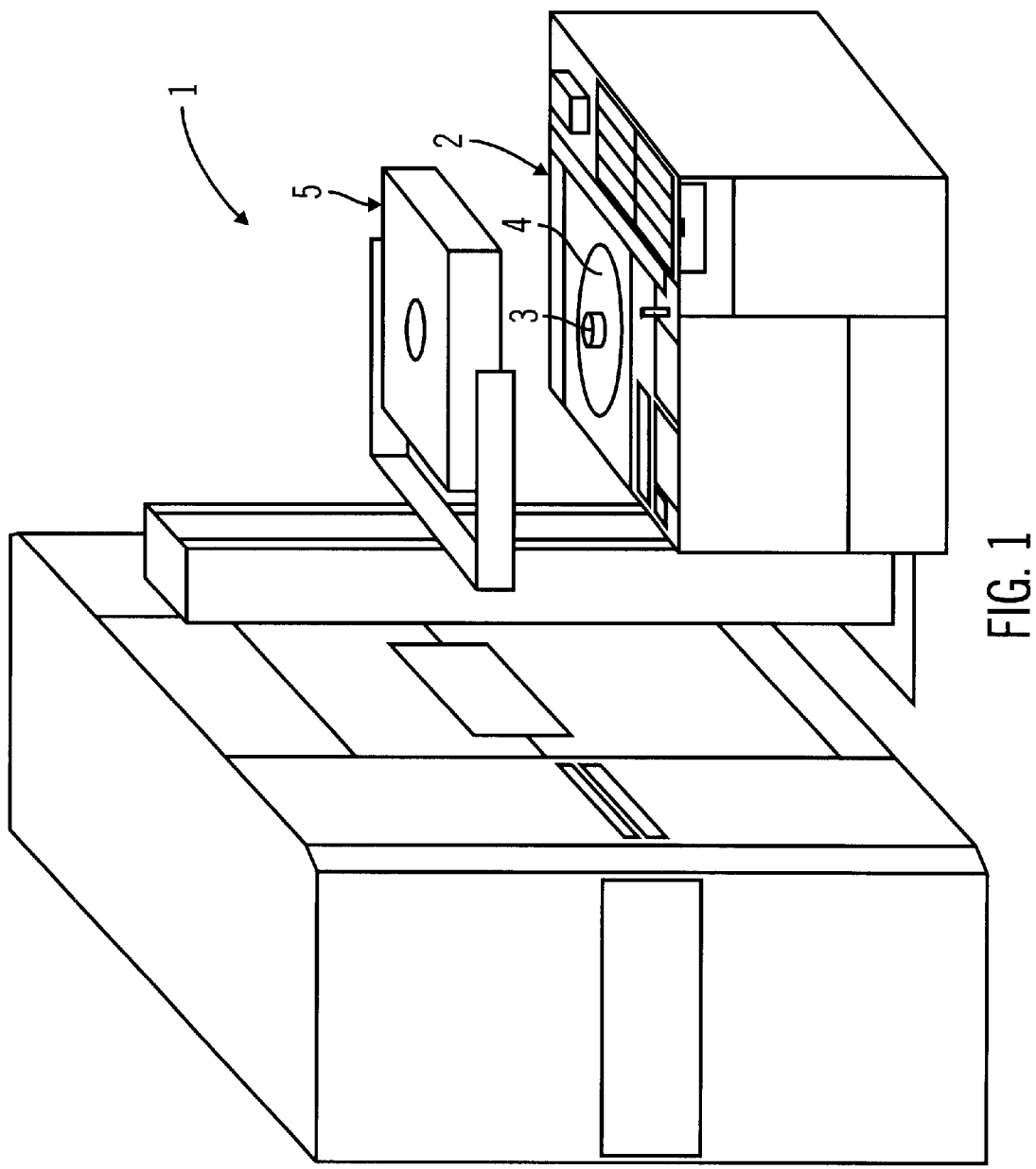
FIG. 1 is a block diagram of a test machine.

Referring to FIG. 1, the test machine 1 illustrated includes a manipulator 2 designed to bring a wafer 3 to be tested into a test zone 4 lying below a test head 5 and for moving this wafer horizontally and vertically with respect to the test head 5 so as to place each of its electronic chips (see FIG. 4) into the test position.

Figure 2:
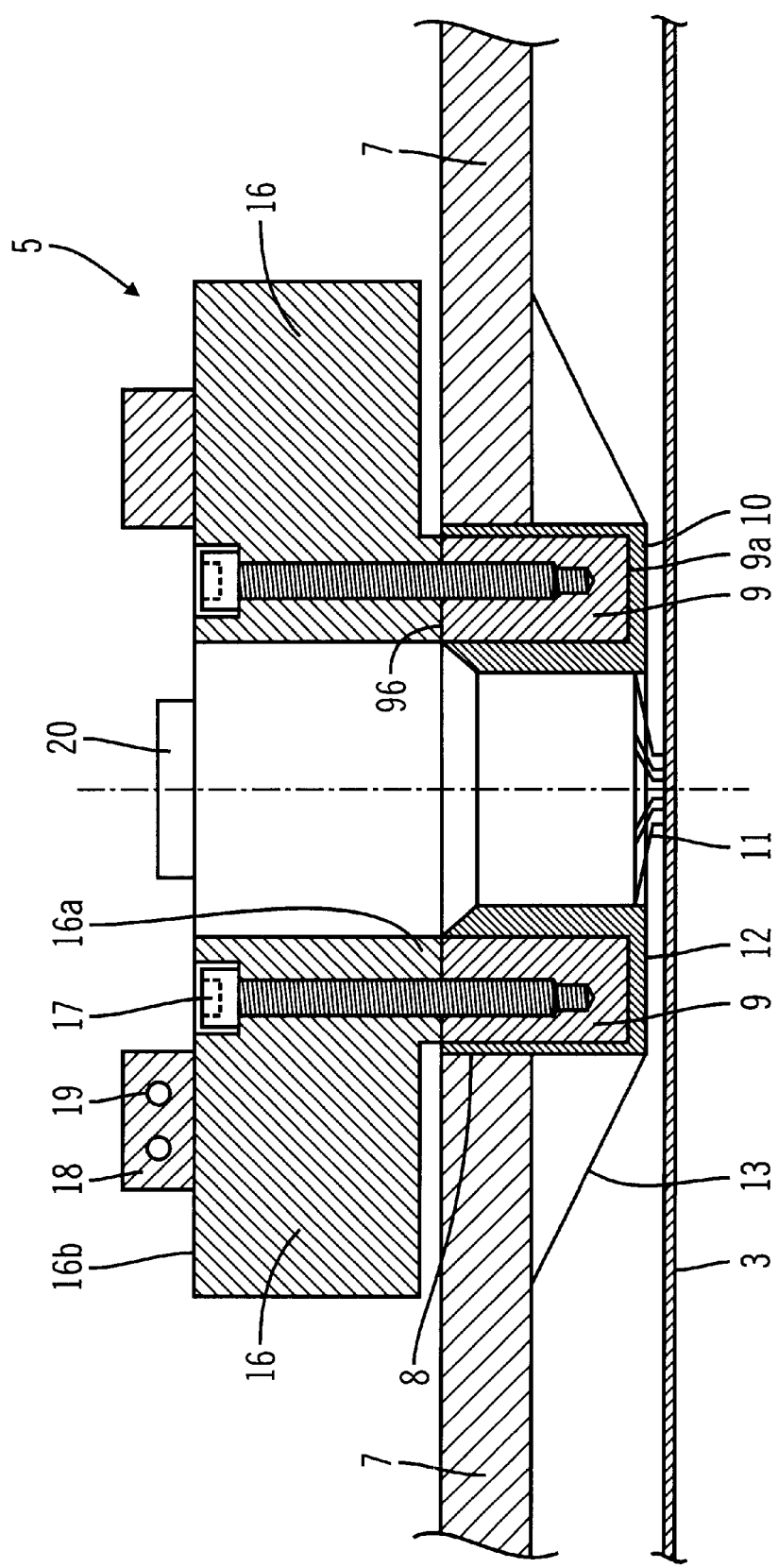
FIG. 2 is a cross-section illustration of the central part of the test head of the machine unit of FIG. 1.
Figure 3:
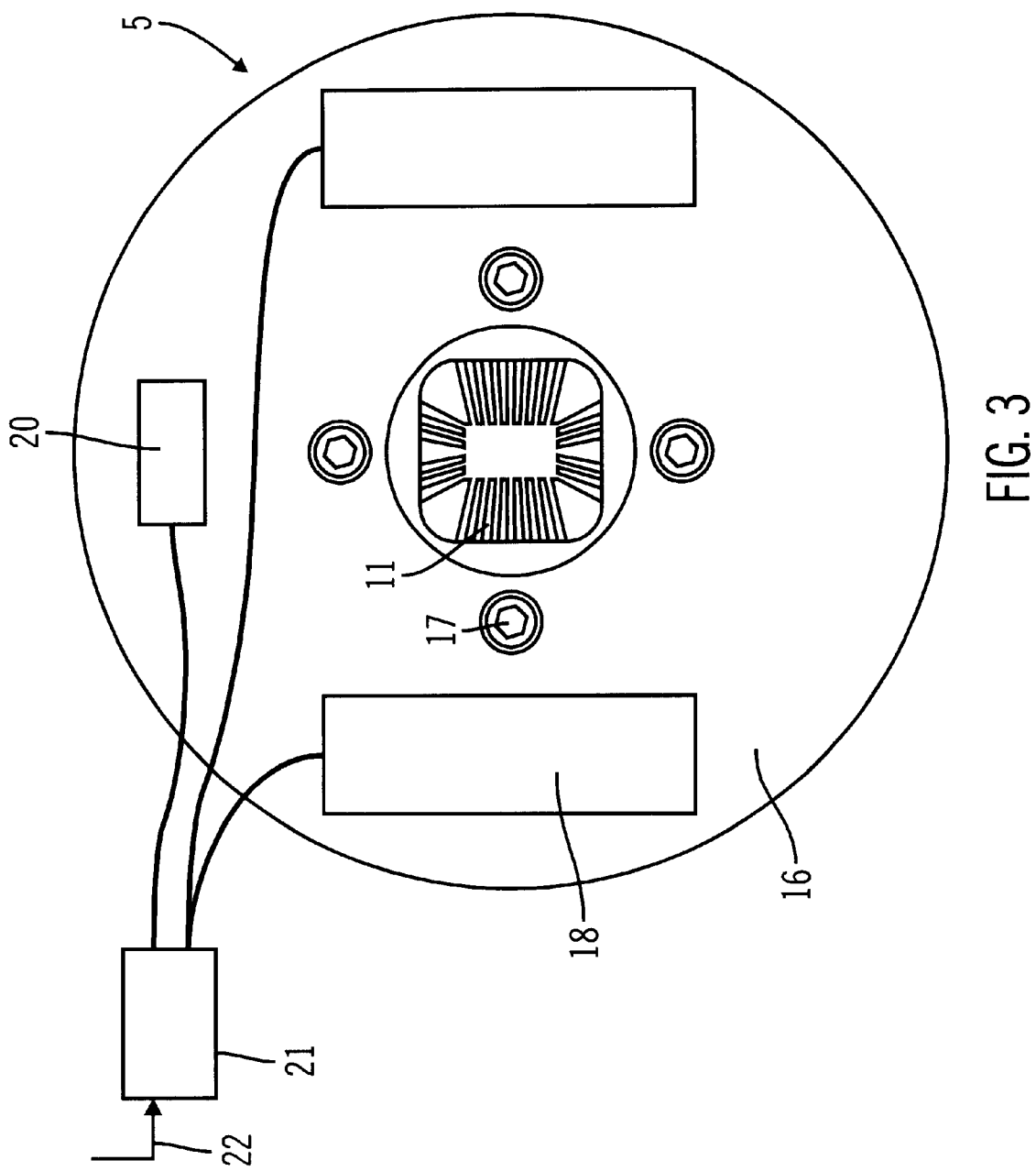
FIG. 3 is a top view of the central part of FIG. 2.

Referring to FIG. 2, the test head 5 includes a horizontal plate 7 forming an electrical connection board which has a cylindrical central passage 8 in which a ring 9 (shown in cross-section) is fixed by means of a layer of ceramic adhesive 10 which furthermore forms an electrical insulation between the plate 7 and the ring 9.

The ring 9 extends downwards beyond the lower face of the plate 7 and carries a multiplicity of electrical connection test prods 11, for example, made of tungsten.

Figure 4:
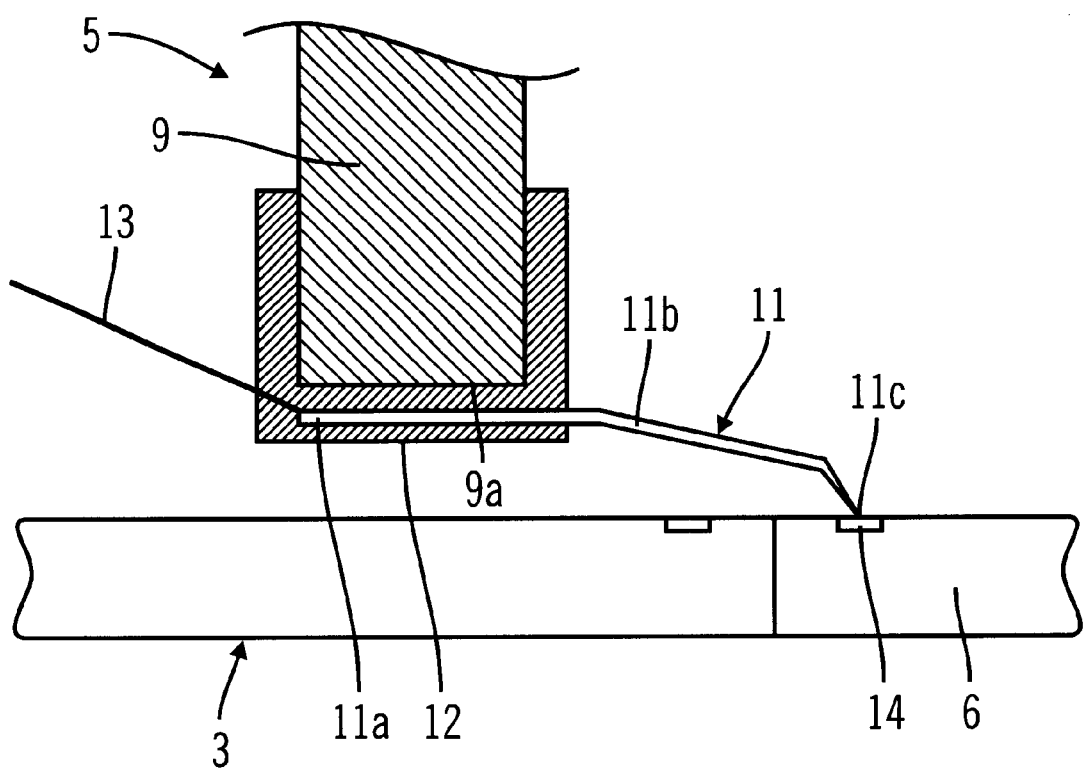
FIG. 4 is an enlarged partial cross section of one side of the said central part.

Referring to FIG. 4, each prod 11 has an outer part 11a which extends in front of and at some distance from the lower face 9a of the ring 9 and which is fixed to the ring 9 by means of a layer of ceramic adhesive 12 forming an electrical insulation, in which layer of adhesive this outer part 11a is embedded, and a part 11b which extends in a cantilever fashion towards the axis of the ring 9 and downwards, so as to present a free end 11c located below the lower plane of the ring 9 and of the layer of adhesive 12. Electrical connection wires 13 have one end soldered to the electrical connection test prods, 11 in the layer of adhesive 12, and their other ends connected to the electrical circuit on the plate 7 (See FIG. 2).

The electrical connection test prods 11 are placed and formed in such a way that their ends 11c may come respectively into contact with the pads 14 on each chip 6, that are produced on the surface of the wafer 3, by moving this wafer 3 upwards using the manipulator 2.

The test head 5 furthermore includes an upper metal block 16, of substantially greater volume than the volume of the ring 9, which is in the form of a cylindrical ring centered on the passage 8 and which has a projecting lower part 16a in contact with the upper face 9b of the ring 9. The ring 16 is fixed to the ring 9 by means of four bolts 17 screwed in from above.

Fixed to the upper face 16b of the ring 16, in diametrically opposed positions, are little blocks, 18, which contain electrical heating elements 19, as well as a temperature sensor 20.

The electrical heating elements 19 and the temperature sensor 20 are connected to an electrical circuit 21, known per se, which is designed to supply the electrical heating elements 19 so as to heat the ring 16 up to a predetermined temperature, programmed as a set value 22, and to maintain this temperature.

The heat of the ring 16 is transmitted, essentially by conduction, to the electrical connection test prods 11 via the ring 9 and through the layer of ceramic adhesive 12 in such a way that the temperature of the electrical connection test prods 11 may be brought to and held at a set value.

Thus, when the wafer 3 is heated and maintained at a predetermined temperature by means incorporated in the manipulator 2, the electrical connection test prods 11 may be also be heated to a temperature close to or the same as that of the wafer 3 by means of the heating and temperature-regulating means formed by the ring 16, which has a high thermal inertia, the heating and temperature regulation of which are provided by the electrical heating elements 19 and the detector 20 under the control of the circuit 21.

Given the fact that the electrical connection test prods 11 and the wafer 3 may be brought to and maintained at the same or very similar temperatures, the positioning and the shape of the electrical connection test prods 11 may be accurately predetermined at the desired temperature and the movements of the wafer 3 produced by the manipulator 2, in order to test the various electronic chips 6 on the wafer 3 in succession, may be precisely predetermined so that the ends of the electrical connection test prods 11 come into proper contact with the pads on each of the electronic chips to be tested.

In addition, the electronic chips 6 on the same wafer 3 may be tested without wasting any time other than the time for transferring from one electronic chip to another.

Of course, heating means other than the electrical heating elements could have been provided.

What is claimed is:

1. A test head for a test machine that tests electronic components included on a wafer, each component including a plurality of electrical connection pads formed on the surface of the wafer, said test head comprising:

a plate having a central passage;

a metal ring having a lower face and an upper face, the metal ring being affixed in the central passage of the plate via a layer of material that forms an insulation between the plate and the metal ring;

a plurality of electrical connection test prods supported by the lower face of the metal ring via an electrically insulating material;

a metal block having a lower face and an upper face, the lower face of the metal block being affixed to the upper face of the metal ring; and heating means affixed to the upper face of the metal block.

2. The test head according to claim 1, wherein the volume of the metal block is substantially greater than the volume of the metal ring.

3. The test head according to claim 1, wherein the metal block is an annular metal block that is centered on the central passage of the plate.

4. The test head according to claim 1, wherein the heating means heats the metal block and heat is transmitted essentially by conduction from the metal block, through the metal ring and the electrically insulating material, to the electrical connection test prods.

5. The test head according to claim 4, wherein the heating means heats the metal block up to a predetermined temperature and maintains the metal block at the predetermined temperature.

6. The test head according to claim 1, wherein the heating means includes:

at least one heating block that is affixed to the metal block; and at least one electrical heating element contained within the heating block.

7. The test head according to claim 6, further comprising a temperature sensor affixed to the metal block.

8. The test head according to claim 7, wherein the electrical heating element and the temperature sensor are coupled to an electrical circuit, the electrical circuit supplying the electrical heating element so as to heat the metal block up to a predetermined temperature and maintain the metal block at the predetermined temperature.

9. The test head according to claim 1, further comprising a temperature sensor thermally coupled to the metal block.

10. The test head according to claim 9, wherein the heating means and the temperature sensor are coupled to an electrical circuit, the electrical circuit supplying the heating means so as to heat the metal block up to a predetermined temperature and maintain the metal block at the predetermined temperature.

11. A machine for testing electronic components included on a wafer, each component including a plurality of electrical connection pads formed on the surface of the wafer, said machine comprising:

a test head having a plurality of electrical connection test prods; and means for moving the wafer to be tested with respect to the test head so as to bring the ends of the electrical connection test prods into contact with the pads of each component, in succession, wherein the test head includes:

a plate having a central passage;

a metal ring affixed in the central passage of the plate via a layer of material that forms an-insulation between the plate and the metal ring, the electrical connection test prods being supported by a lower face of the metal ring via an electrically insulating material;

a metal block having a lower face and an upper face, the lower face of the metal block being affixed to an upper face of the metal ring; and heating means affixed to the upper face of the metal block.

12. The machine according to claim 11, wherein the volume of the metal block is substantially greater than the volume of the metal ring.

13. The machine according to claim 11, wherein the metal block is an annular metal block that is centered on the central passage of the plate.

14. The machine according to claim 11, wherein the heating means heats the metal block and heat is transmitted essentially by conduction from the metal block, through the metal ring and the electrically insulating material, to the electrical connection test prods.

15. The machine according to claim 11, wherein the heating means includes at least one electrical heating element that is provided on or within the metal block.

16. The machine according to claim 11, further comprising:

a temperature sensor thermally coupled to the metal block; and an electrical circuit coupled to the heating means and the temperature sensor, the electrical circuit supplying the heating means so as to heat the metal block up to a predetermined temperature and maintain the metal block at the predetermined temperature.

17. A test head for a test machine that tests electronic components included on a wafer, each component including a plurality of electrical connection pads formed on the surface of the wafer, said test head comprising:

a plate having a central passage;

a metal ring having a lower face and an upper face, the metal ring being affixed in the central passage of the plate;

a plurality of electrical connection test prods supported by the lower face of the metal ring via an electrically insulating material;

a metal block affixed to the upper face of the metal ring; and at least one heating element thermally coupled to the metal block, wherein the at least one heating element is not located within the metal ring, and the volume of the metal block is substantially greater than the volume of the metal ring.

18. The test head according to claim 17, wherein the metal block is an annular metal block that is centered on the central passage of the plate, the metal block having a lower face that is in contact with the upper face of the metal ring.

19. The test head according to claim 17, wherein the at least one heating element is provided on or within the metal block.

20. The test head according to claim 17, wherein the at least one heating element is located within or coupled onto the metal block so as to be located above the upper face of the metal ring.

21. The test head according to claim 17, wherein the metal ring is affixed in the central passage of the plate via an adhesive layer of adhesive that forms an insulation between the plate and the metal ring.

* * * * *